US007205705B2

(12) United States Patent
Iwamoto

(10) Patent No.: US 7,205,705 B2

(45) Date of Patent: Apr. 17, 2007

(54) ELECTRONIC COMPONENT AND METHOD OF PRODUCING THE SAME

(75) Inventor: Takashi Iwamoto, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 134 days.

(21) Appl. No.: 10/715,396

(22) Filed: Nov. 19, 2003

(65) Prior Publication Data

US 2004/0145278 A1 Jul. 29, 2004

(30) Foreign Application Priority Data

Dec. 19, 2002 (JP) ............................ 2002-368518
May 12, 2003 (JP) ............................ 2003-133248

(51) Int. Cl.
*H01L 41/053* (2006.01)

(52) U.S. Cl. ...................... 310/340; 310/344; 310/348

(58) Field of Classification Search ................ 310/340, 310/344, 348, 349

See application file for complete search history.

(56) References Cited

U.S. PATENT DOCUMENTS 3,396,287 A * 8/1968 Horton ....................... 310/312
6,307,300 B1 * 10/2001 Yamamoto et al. ......... 310/322
6,621,379 B1 * 9/2003 Goetz et al. ................ 333/193
7,067,963 B2 * 6/2006 Tsuda et al. ................ 310/348
2001/0004180 A1 * 6/2001 Kishimoto .................. 310/324
2002/0140322 A1 * 10/2002 Suga et al. ................. 310/348
2002/0189832 A1 * 12/2002 Baba et al. ............... 174/35 R
2005/0029906 A1 * 2/2005 Miyaji ........................ 310/348

FOREIGN PATENT DOCUMENTS

JP 08-213874 A 8/1996
JP 8-330894 12/1996
JP 2000-261284 * 9/2000
JP 2001-102905 A 4/2001
JP 2001-196488 * 7/2001
JP 2002-290183 10/2002

OTHER PUBLICATIONS

Official Communication issued in the corresponding Chinese Patent Application No. 200310120192.1, mailed on Jun. 23, 2006.

* cited by examiner

*Primary Examiner*—Thomas M. Dougherty
(74) *Attorney, Agent, or Firm*—Keating & Bennett, LLP

(57) ABSTRACT

An electronic component includes at least one piezoelectric vibrating portion, a connecting portion provided on a substrate, a structural piece including a concavity so as not to disturb the vibration of the piezoelectric vibrating portion, and a connecting wiring for electrically connecting a pad on the substrate to a mounting wiring disposed on the upper surface of the structural piece. The structural piece further includes a through hole having an electroconductive material filled therein. The structural piece seals the piezoelectric vibrating portion.

9 Claims, 14 Drawing Sheets

60

ELECTRONIC COMPONENT AND METHOD OF PRODUCING THE SAME

BACKGROUND OF THE INVENTION

1. Field of the Invention

The present invention relates to an electronic component for use in an electronic circuit in the communication field such as a portable telephone or a television, which includes at least one piezoelectric vibrating-portion and a connecting portion provided on a substrate.

2. Description of the Related Art

The basic structure of such electronic components includes a piezoelectric vibrating-portion provided on a substrate, which is accommodated in a package providing an air tight seal, in order to ensure its reliability.

A portion of the package corresponding to the upper surface of the piezoelectric vibrating portion includes a space such that the vibration of the piezoelectric vibrating portion provided on the substrate is not disturbed. A package made of a metal or ceramic is used to ensure the reliability. However, the above-described structure increases the size of the package. This prevents size reduction of electronic components.

Moreover, the substrate must be provided with an electrical connection for input-output, in order to realize the characteristics of the piezoelectric vibrating portion formed thereon. To provide such an electrical connection, a connecting portion provided on the substrate and another desired connecting portion are electrically connected via a wire or a bump. However, this increases the size of the electronic component.

The following electronic component is disclosed (e.g., see Japanese Unexamined Patent Application Publication No.1996-330894 (Patent Document 1)). In a surface acoustic wave device having a piezoelectric substrate including components disposed thereon, the piezoelectric substrate and a glass member having a space to permit vibration of the surface acoustic wave with the thermal-expansion-coefficient in conformity to that of the piezoelectric substrate, are anode-joined to each other, and are sealed. Moreover, a through hole is provided in the glass member such that the piezoelectric substrate is electrically connected to the outside. Thus, the electronic component itself defines a package base.

However, the above-described electronic component including the piezoelectric substrate sealed with a glass member has the following problems. According to Patent Document 1, in order to seal an IDT electrode provided on the piezoelectric substrate, the glass member, having a space provided on the upper portion of an IDT electrode so as not to disturb the vibration, is anode-joined to the piezoelectric substrate. However, generally, piezoelectric substrates have a high insulating property. Thus, for application of an electronic field, it is necessary to provide an electroconductive member on the joining portions. Therefore, a wiring can not be provided in the joining portions. Thus, the size of electronic component cannot be sufficiently reduced.

Moreover, the glass member must have a thermal expansion coefficient that is equal to that of the piezoelectric substrate. Thus, glass members including moving ions such as lithium ions, sodium ions, or other ions are used. The moving ions have corrosive action on electrode materials such as Al. Thus, the moving ions greatly reduce the reliability of electronic component.

As a method of forming a space in the glass member, a metal is formed into a mask by sputtering or other suitable method, and is etched with hydrofluoric acid or other suitable etching substance to form a space. These processes greatly increase the manufacturing costs.

Moreover, an electrochemical discharge-drilling technique or a supersonic wave drilling technique is used to form the through hole in the glass piece. This technique is limited with respect to the size of the through hole to be formed, cannot be used in mass production, and is expensive.

Moreover, the glass piece is likely to be cracked or broken during the through processing of a wafer because of the low mechanical strength of the glass piece. When the above-described structure is used, the thickness of the sealing cap must be reduced to reduce the height of the electronic component. However, when the thickness of the sealing cap is reduced, the mechanical strength of the sealing cap is reduced. Thus, the sealing cap is often broken during the manufacturing process.

SUMMARY OF THE INVENTION

To overcome the problems described above, preferred embodiments of the present invention provide an electronic component which includes a substrate, at least one piezoelectric vibrating portion and a connecting portion provided on the substrate, and a structural piece made of a resin material having a flat plate shape and covering at least the piezoelectric vibrating portion, the structural piece having an integrated structure including a top portion covering the piezoelectric vibrating portion and side walls, and provided with a concavity to provide a space so as not to disrupt at least the vibration of the piezoelectric vibrating portion. The structural piece seals at least the piezoelectric vibrating portion.

Preferably, the structural piece includes a mounting portion provided on the upper surface thereof, and a connecting wiring for electrically connecting the mounting portion to the connecting portion. Further, preferably, the mounting portion does not overlap the connecting portion in the thickness direction of the structural piece.

Also, preferably, the concavity is formed by half-processing the structural piece made of a resin material using a laser beam. Moreover, preferably, the concavity is formed by a photolithographic process from the structural piece made of a resin material. Also, preferably, the structural piece is preferably formed of a polyimide film or a liquid crystal polymer film. Preferably, the structural piece is made from a photosensitive material.

A preferred embodiment of the present invention provides a method of producing an electronic component including a substrate, at least one piezoelectric vibrating portion and a connecting portion formed on the substrate, and a structural piece made of a resin material having a flat plate shape and covering the piezoelectric vibrating portion, which includes the steps of forming a concavity and a through hole in the structural piece, aligning and joining the concavity of the structural piece with the piezoelectric vibrating portion, and, moreover, the through hole with the connecting portion, such that the piezoelectric vibrating portion is sealed with the concavity of the structural piece, forming a mounting portion on the upper surface of the structural piece, and forming a connecting wiring for electrically connecting the connecting portion to the mounting portion.

Preferably, the concavity and the through hole are formed with a laser beam. Also, preferably, the concavity and the through hole are formed by a photolithographic process.

Preferably, a photo-mask used in the photolithographic process is a manufacturing method of electronic components, and includes a portion thereof which corresponds to the concavity and a portion thereof which corresponds to the through hole. The former includes a pattern in which the photosensitive material in an exposure state where the material cannot be completely removed at its development, and a pattern in which the photosensitive material reaches such an exposure state where the material is resistant to a developing liquid when developed, and the latter includes a pattern in which the photosensitive material is in an exposure state where the material can be completely removed when developed.

According to the electronic component of preferred embodiments of the present invention, the structural piece includes the space to permit the vibration of the piezoelectric vibrating portion and a structural piece for sealing the piezoelectric vibrating portion. Accordingly, the electronic component has a reduced height and size. The structural piece can be mounted on the substrate so as to cross the wiring disposed on the substrate. Thus, the chip size is greatly reduced.

Moreover, the formation process for electrically connecting the connecting portion provided on the substrate to the mounting wiring is simple. The thermal expansion coefficient of the structural piece of the electronic component of preferred embodiments of the present invention can be made equal to that of the substrate by changing the crystallinity thereof, and moreover, the structural piece of the electronic component of the present invention causes no corrosion of electrodes. The resin material for the structural piece has a high processability. The structural piece can be processed by a laser process or a photolithographic process. Thus, the structural piece can be finely processed at high speed and high accuracy. This facilitates the reduction in size of the electronic component. Moreover, the resin material caused less damage to the substrate, due to the properties thereof.

In the electronic component of preferred embodiments of the present invention, the structural piece is joined to the substrate having the at least one piezoelectric vibrating portion and the connecting portion. Thus, the electronic component has a reduced size and height, and the manufacturing costs are greatly reduced.

The above and other elements, characteristics, features, steps, and advantages of the present invention will become clear from the following description of preferred embodiments taken in conjunction with the accompanying drawings.

DETAILED DESCRIPTION OF PREFERRED EMBODIMENTS

Hereinafter, preferred embodiments of the present invention will be described in detail with reference to the accompanying drawing.

Figure 1:
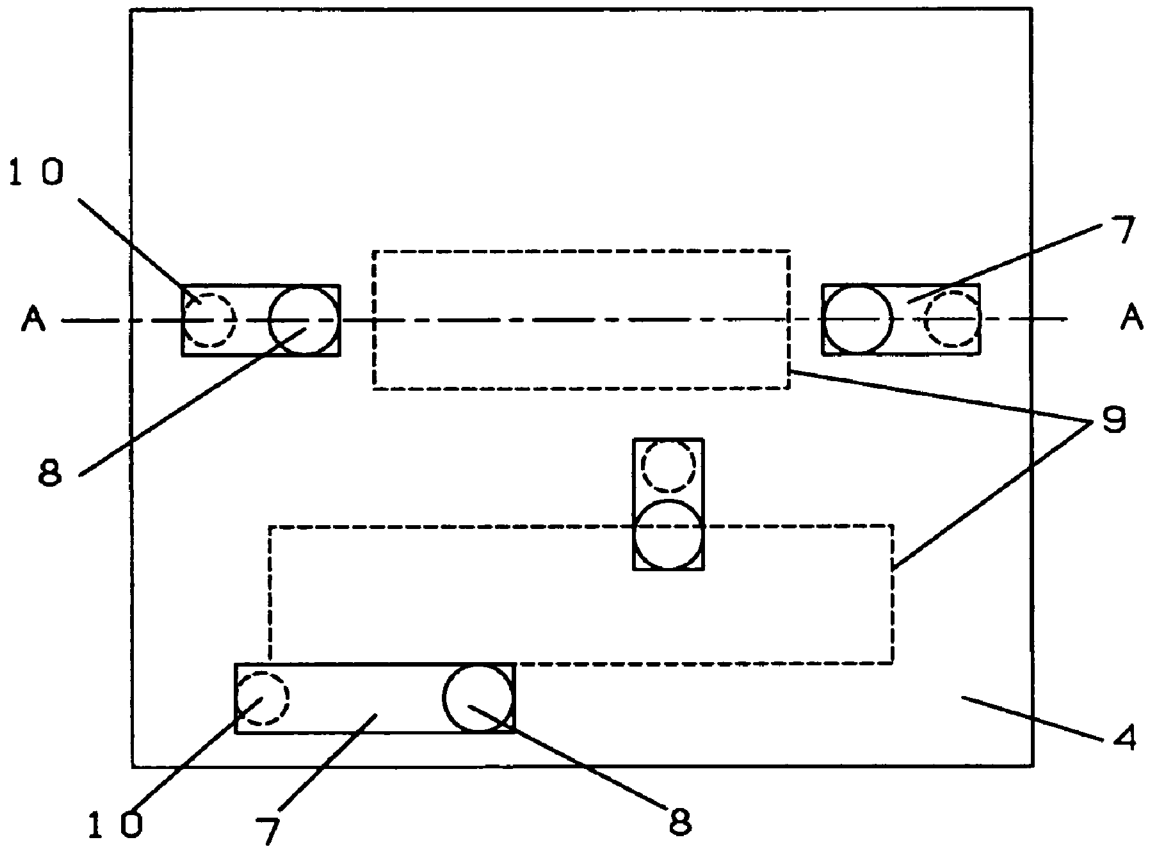
FIG. 1 is a plan view of an electronic component according to a preferred embodiment of the present invention.
Figure 2:
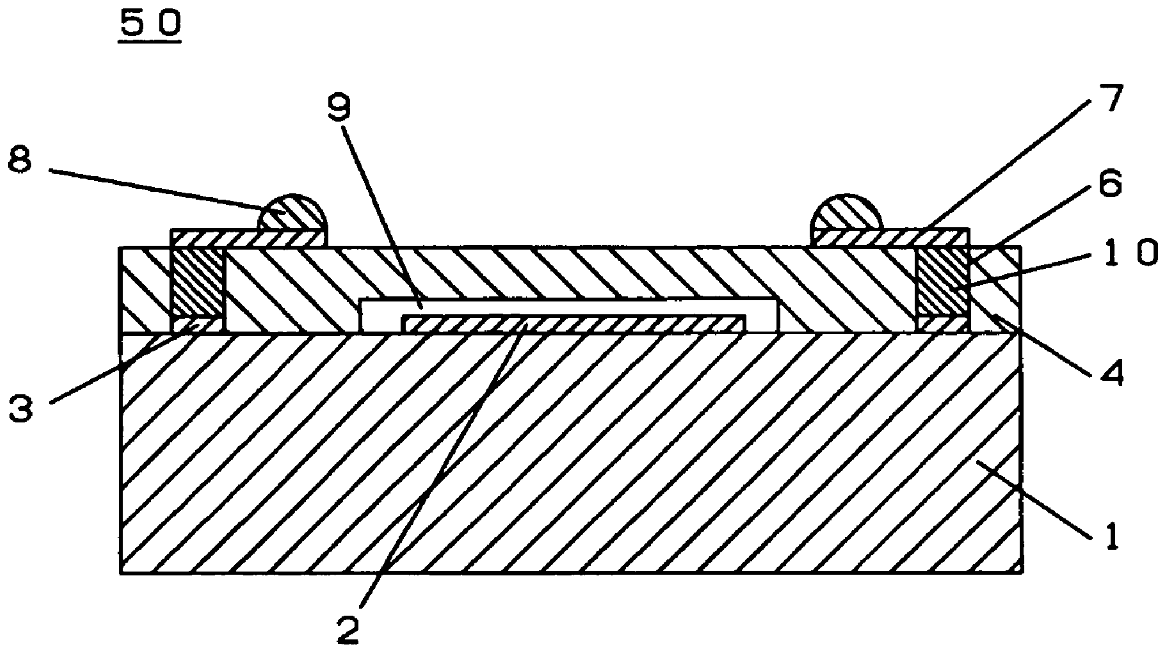
FIG. 2 is a cross-sectional view of the electronic component according to a preferred embodiment of the present invention.

FIG. 1 is a schematic plan view of an electronic component according to a preferred embodiment of the present invention. FIG. 2 is a cross-sectional view taken along line A—A in FIG. 1.

Referring to FIGS. 1 and 2, an electronic component 50 includes a substrate 1 and a structural piece 4.

A plurality of IDT electrodes 2 and connecting portions 3 are provided on the substrate 1. The connecting portions 3 are electrically connected to the IDT electrodes 2. Thus, a desired function is performed. Moreover, electrodes having patterns and film-thicknesses suitable for desired functions are provided on the IDT electrodes 2. The patterns are not restricted to the IDT electrodes 2. The patterns may be applied to electrodes which define a piezoelectric vibrating portion.

Pads 5 are provided on the upper surfaces of the connecting portions 3. Moreover, a protecting film 17 is provided on the back surface of the substrate 1.

A plurality of concavities 9 are provided on the lower surface of the structural piece 4. These concavities provide spaces which permit the vibration of the IDT electrode 2. Moreover, mounting wirings 7 are provided on the upper surfaces of the structural piece 4. Bump pads 18 are provided on the upper surfaces of the mounting wirings 7. Further, bumps 8 are provided on the upper surfaces of the bump-pads 18. In the structural piece 4, an electro-conductive material 10 is filled into through holes 6 (hereinafter, referred to as a connecting wiring) for electrically connecting the mounting wirings 7 to the pads 5 provided on the upper surfaces of the substrate 1.

The structural piece 4 is attached to the surface of the substrate 1 on which the IDT electrodes 2 are provided. In this case, the IDT electrodes 2 provided on the substrate 1 are covered with the concavities 9 provided in the structural piece 4, such that the IDT electrodes 2 are sealed. Moreover, the pads 5 provided on the substrate 1 are electrically connected to the conductive material 10 filled in the through holes 6 of the structural piece 4.

As described above, the electronic component 50 is provided with the structural piece 4 having the concavities 9 and the conductive wirings. Thus, increasing of the volume of the electronic component 50 is reduced as much as possible, as compared to an electronic component which does not include the structural piece. Furthermore, the thickness of the structural piece 4 is reduced to about 0.05 mm. Thus, the size and height of the electronic component 50 is greatly reduced.

Moreover, the through holes 6 are finely processed with greatly improved accuracy by laser-processing. Thus, a complicated process such as photolithography is not required. Moreover, the processing time is greatly reduced. Thus, the through holes are produced at a greatly reduced cost.

Moreover, a liquid-crystal polymer may be used for the structural piece 4. In this case, the crystalline property of the structural piece 4 is easily adjusted, and thereby, the thermal expansion coefficient of the structural piece 4 is set to be substantially equal to the thermal expansion coefficient of the substrate 1. Thus, positional-slipping, which is caused by a difference between the thermal expansion coefficients of the structural piece 4 and the substrate 1, is prevented. Thus, the electronic component is suitable for through production on a wafer-level.

The locations of the bumps 8 which define flip-chip mounting portions are set so as not to overlap the locations of the connecting portions 3 in the thickness direction of the structural piece 4. Thereby, stress, generated by flip-chip mounting, is prevented from being transmitted to the substrate 1 via the connecting wirings. The structural piece 4 is flexible, as compared to glass and ceramics. Thus, the structural piece 4 absorbs the stress. Accordingly, an electronic component which causes less damage to the substrate 1 is provided. The bumps 8 can be freely arranged on the upper surface of the structural piece 4 in correspondence to a mounting substrate, provided that the above-described conditions are taken into account. Moreover, the electronic component is processed into chip-size after the IDT electrodes 2 are sealed with the structural piece 4. Therefore, the electronic component is not damaged when the IDT electrodes 2 are cut, and the number of rejected products, which occurs due to the adhesion of cut-waste, is greatly reduced. This enhances the acceptance ratio of products and further reduces the cost thereof.

The method of producing the above-described electronic component of the present invention will be described in detail with reference to FIG. 3A to FIG. 5D which schematically show a process flow of the electronic component.

First, the method of producing the substrate 1 will be described with reference to the schematic process flow of FIGS. 3A to 3D.

Figure 3A:
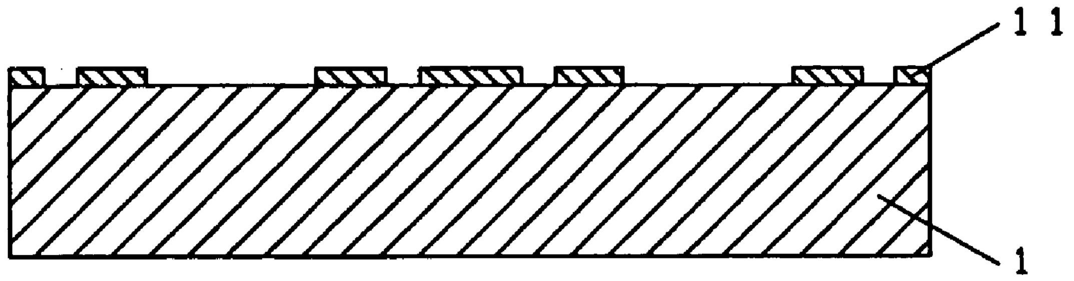
FIGS. 3A to 3D schematically show a process flow of the formation of a substrate of an electronic component according to a preferred embodiment of the present invention.

As shown in FIG. 3A, a desired resist pattern is formed on the upper surface of the substrate 1 by a photolithographic process. In particular, first, a resist having a predetermined film-thickness is formed by coating using a spin coating machine or other suitable machine. Then, the resist is exposed via a photolithographic mask having a desired pattern formed thereon, and is developed. Thus, a resist pattern 11 having openings formed in required locations is formed by the development. For the substrate 1, $LiTaO_3$, quartz, $LiNbO_3$, $Li_2B_4O_7$, or other suitable material is used, corresponding to a piezoelectric characteristic desired for the substrate 1. Preferably, with consideration for the lifting-off, the resist pattern 11 is formed in an inverted-tapered shape (becomes wider toward the substrate 1).

Figure 3B:
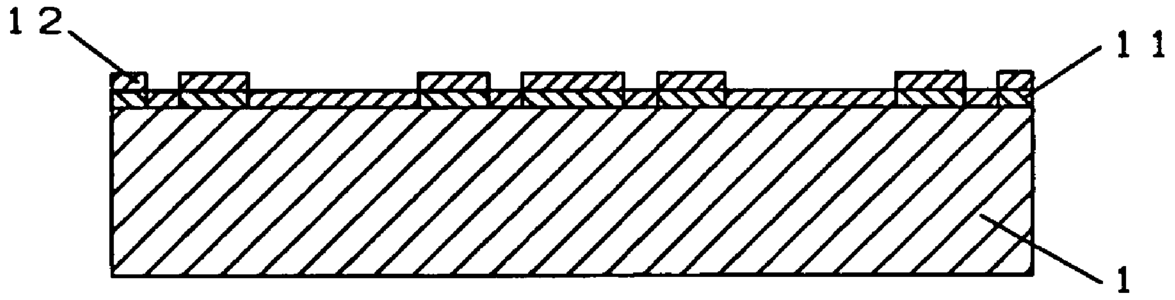
Figure 3C:
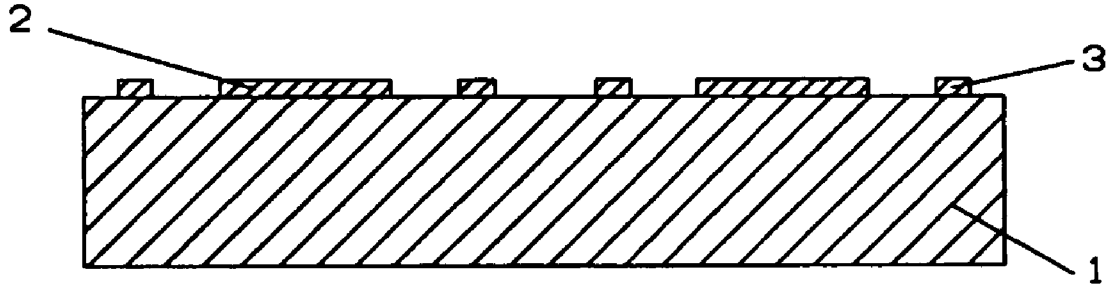

Subsequently, as shown in FIG. 3B, Al electrode material is formed into a film having a desired film-thickness by vacuum evaporation. The electrode material 12 is not restricted to Al. Cu, an Al—Cu alloy, Au, or other suitable materials may be employed. Then, the substrate is dipped into a releasing liquid, and is rocked, such that the resist pattern 11 and the unnecessary electrode material are removed. Thus, as shown in FIG. 3C, the IDT electrodes 2, a bus bar (not shown), reflectors (not shown), the connecting portion 3, and wirings (not shown) for electrically connecting these elements are formed.

Figure 3D:
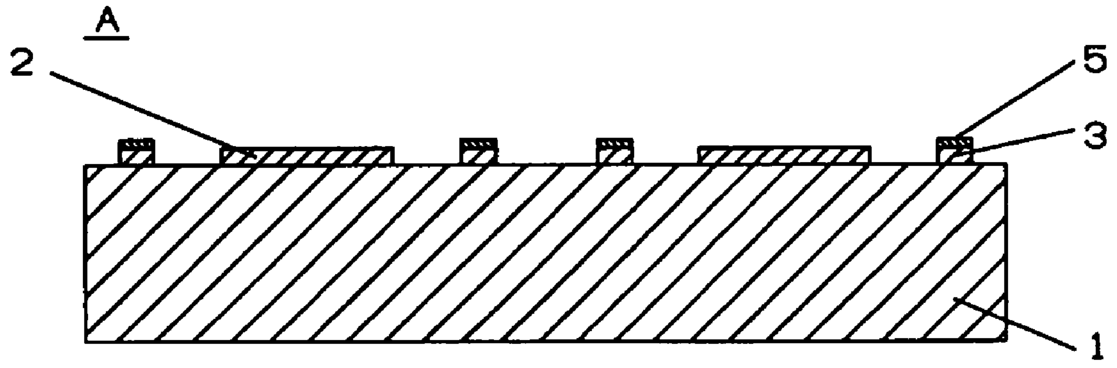

Subsequently, as shown in FIG. 3D, the pads 5 are formed on the upper surfaces of the connecting portions 3 formed on the substrate 1. In particular, to form the pads 5, first, a resist pattern having openings corresponding to the upper surfaces of the connecting portions 3 is formed by a photolithographic process. Then, Ti, Ni, and Sn are formed into films having thicknesses of about 10 nm, about 100 nm, and about 1000 nm, respectively, by vacuum evaporation. Preferably, these films are formed continuously, such that the vacuum is maintained. Thereafter, the substrate 1 is dipped in a releasing liquid, and is rocked, such that the resist and the unnecessary films are removed. Thus, the pads 5 are formed. A piece B is formed which includes the IDT electrodes 2, the connecting portions 3, and the pads 5 formed on the upper surface of the substrate 1.

Hereinafter, a method of producing the structural piece 4 will be described with reference to a process flow schematically shown in FIG. 4.

Figure 4A:
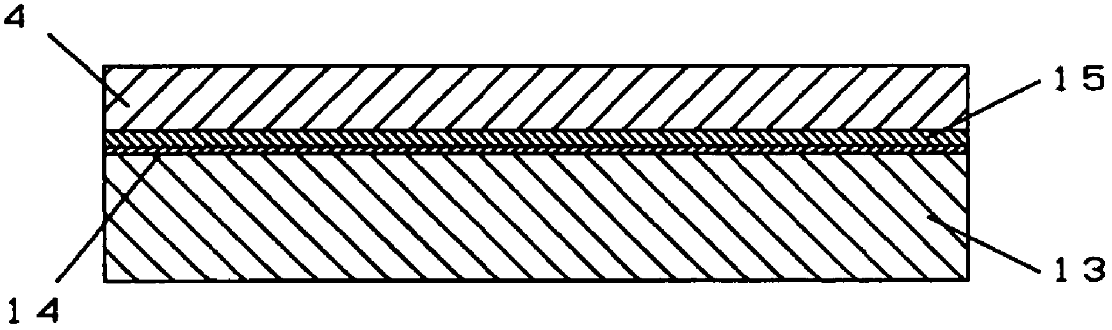
FIGS. 4A to 4C schematically show a process flow of a structural piece of the electronic component according to a preferred embodiment of the present invention.

First, as shown in FIG. 4A, a thermoplastic resin film 14 is formed on a mirror-finished temporary-bonding substrate 13. Thereafter, the structural piece 4 having a Cu foil 15 with a thickness of about 0.03 mm is bonded to the upper surface of the substrate 13 having the thermoplastic resin film 14 formed thereon with the Cu foil 15 being on the temporary-bonding substrate 13 side.

Figure 4B:
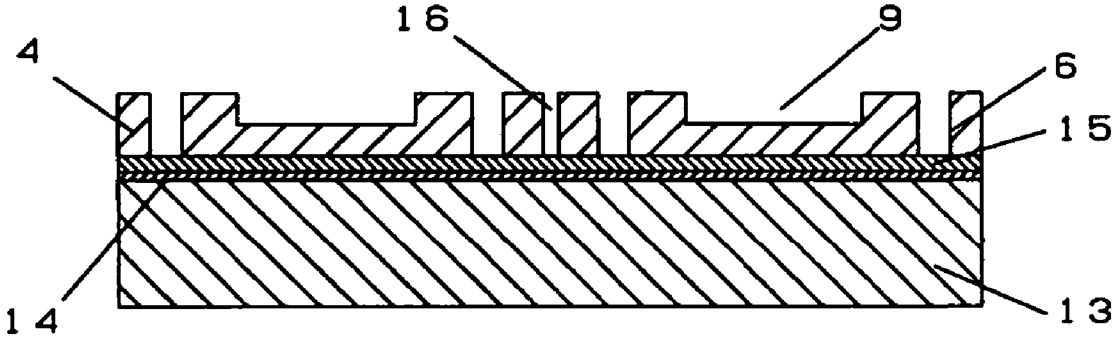

Next, as shown in FIG. 4B, the concavities 9, the through-holes 6 and cut-lines 16 are formed by laser processing.

In particular, the concavities 9 are formed so as to have a depth of about 0.015 mm. Referring to the laser processing conditions employed for a liquid crystal polymer film used as the structural piece 4, the processing is carried out at a laser beam wavelength of about 532 nm, an oscillation frequency of about 30 kHz, and an energy density of about 20,000 $J/m^2$. These laser processing conditions are set so as to correspond to a desired depth and processing speed. The laser processing is performed at a laser beam wavelength of up to about 532 nm, an oscillation frequency of at least about 5 kHz, and an energy density of up to about 50,000 $J/m^2$ to form the concavities 9 having a depth and processing qualities such that the concavities do not disturb the vibration of the IDT electrodes 2. Moreover, a satisfactory processing precision is obtained at a short laser-beam wavelength, that is, at wavelengths of about 355 nm and about 266 nm.

To form one concavity 9, 48 shots are required on the condition that the area of the concavity 9 is about 0.3 mm ×about 0.4 mm, the diameter of the laser beam is about 0.1 mm, and the overlapping width of the laser beam during processing is about 0.05 mm. In this case, at a laser beam wavelength of about 30 kHz, the concavities 9 are formed at a speed of about 725 sites/sec. Thus, the concavities 9 are processed at a very high speed.

The through holes 6 and the cut lines 16 are formed so as to pass through the structural piece 4. The through holes 6 are formed to be perforations corresponding to the connecting portions 3 and the pads 5 formed on the substrate 1. The sizes of the cut lines 16 are set in accordance with the processing-conditions used for cutting into a chip size in an after-process. The energy density of the laser is set to be relatively high as compared to that for the concavities 9. In this case, the processing of the through holes 6 and the cut lines 16 is performed at a very high speed, as well as that of the concavities 9. In order to further improve processing quality, the laser processing is preferably performed in a reduced pressure atmosphere. The respective processing conditions are determined corresponding to the required accuracy and qualities.

Figure 4C:
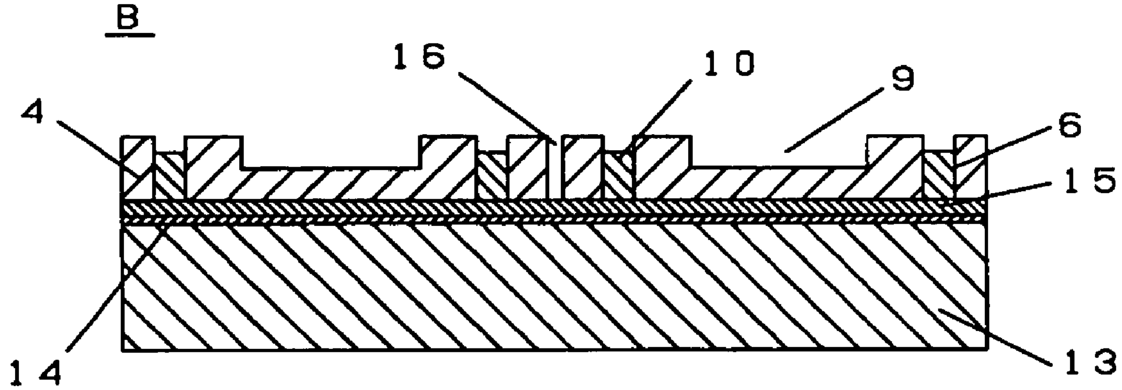

Subsequently, as shown in FIG. 4C, electroconductive paste as the conductive material 10 is filled into the formed through holes 6. After filling, the paste is heat-treated at approximately 200° C. for about 2 hours. Thus, the connecting wirings are formed.

Thus, on the temporary-bonding substrate 13, a piece C is formed to include the structural piece 4 provided with the structural piece 4 which has the concavities 9 so as not to disturb the vibration of the IDT electrodes 2, the connecting wirings, and the cut lines 16 formed thereon.

Hereinafter, a method of producing an electronic component according to a preferred embodiment of the present invention will be described with reference to a process flow schematically shown in FIGS. 5A to 5D.

Figure 5A:
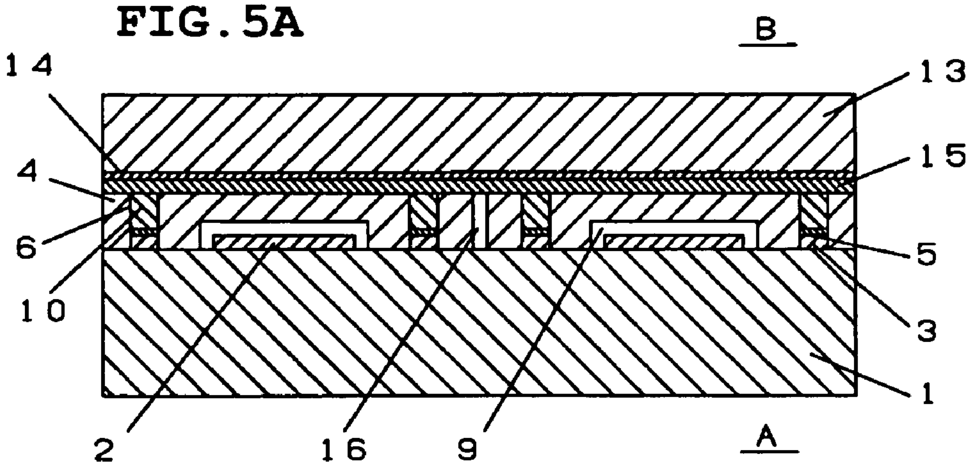
FIGS. 5A to 5D schematically show a process flow of the electronic component according to a preferred embodiment of the present invention.

First, as shown in FIG. 5A, the piece C is mounted onto the piece B.

The pieces B and C are heated and press-bonded to each other, while the conductive material 10 filled in the through holes 6 is aligned with the pads 5 on the substrate 1, and moreover, the IDT electrodes 2 are aligned with the concavities 9 so as not to disturb the vibration of the IDT electrodes 2. In this case, a bonding device having both functions of aligning and heating is used for the bonding. Sn formed on the uppermost surfaces of the pads 5 is melted at a bonding temperature of about 240° C., and is electrically connected to the conductive material 10, and also, the structural piece 4 is joined to the substrate 1 due to the pressing applied for the bonding. In this case, the IDT electrodes 2 are sealed with the structural piece 4.

The thermal expansion coefficient of the structural piece 4 is set to be substantially equal to that of the substrate 1 by using the same material as that of the substrate 1 and adjusting an additional amount of an inorganic filler. Thereby, the positional slipping between the structural piece 4 and the substrate 1, which may occur during bonding of the structural piece 4 and the substrate 1, is suppressed as much as possible. The thermal expansion coefficients are set to be substantially equal to each other. However, no problems will occur, if the slipping range is within about ±5 ppm.

Moreover, a material for the structural piece 4 is selected to correspond to an electronic component to be formed. If the moisture-proofing of the structural piece 4 is not important, or bonding of the structural piece 4 to the substrate 1 on a wafer level is not required, a polyimide film or other suitable material, which can be processed with a laser beam and has a chemical stability and a heat resistance, is selected.

Figure 5B:
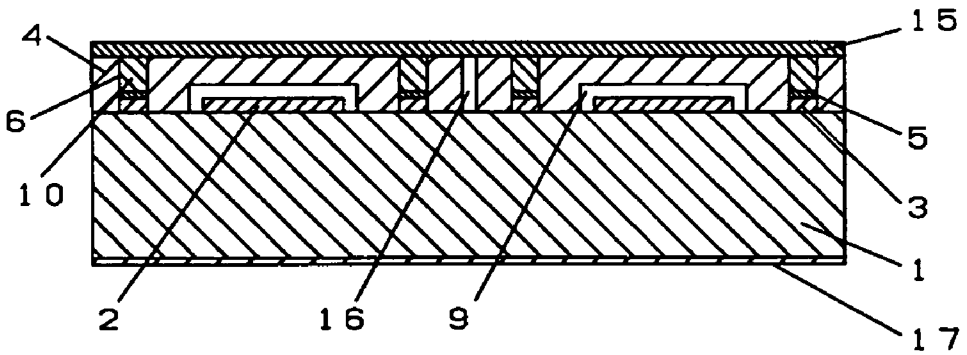

Subsequently, as shown in FIG. 5B, the temporary-bonding substrate 13 is released from the structural piece 4. In particular, the thermoplastic resin film 14 is provided at the interface between the temporary-bonding substrate 13 and the structural piece 4. The temporary-bonding substrate 13 is easily removed by heating the substrate 1 at about 150° C.

If the surface of the Cu foil 15 provided on the structural piece 4 is stained with the thermoplastic resin, the Cu foil is cleaned at this stage. Furthermore, for the purpose of marking and protection of the substrate 1, a resin film having a thickness of about 0.03 mm is formed by coating, and heat-treated to be cured. For the structural piece 4, epoxy resins, acrylic ester resins, polyimide, benzocyclobutene resins, cyclic olefin resins, or other suitable materials may be used. It is preferable to use resins which are strengthened by heat-curing such that the substrate 1 is protected against impact.

Figure 5C:
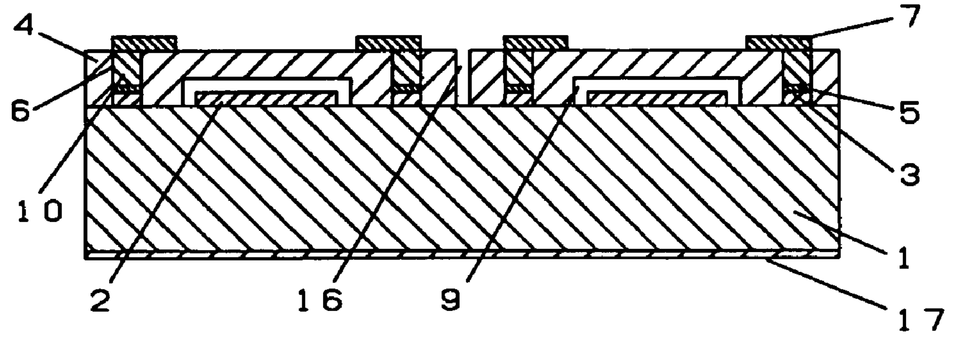

Subsequently, as shown in FIG. 5C, the Cu foil 15 formed on the structural piece 4 is processed by a photolithographic process to form the mounting wirings 7.

Figure 5D:
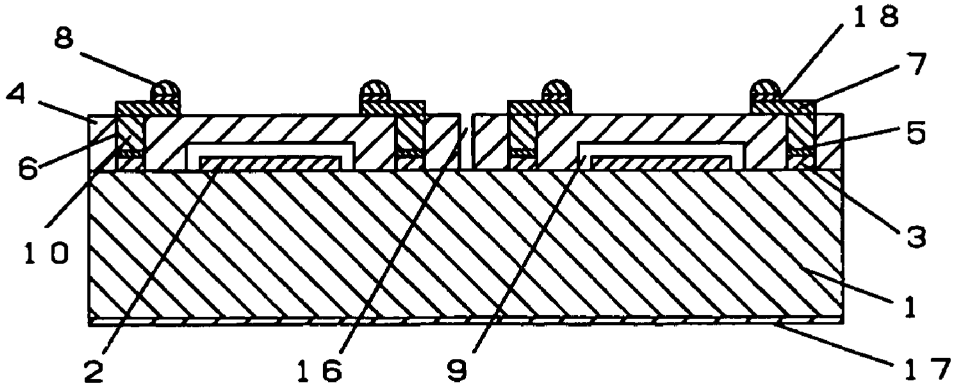

Then, as shown in FIG. 5D, the bump pads 18 are formed by a photolithographic process. For formation of the bump pads 18, a resist pattern is formed which includes openings at locations that correspond to the bump pads 18 to be formed, and, thereafter, an Ni film is formed, and lifting-off is carried out.

Moreover, bumps 8, which define bumps for mounting on an external substrate, are formed on the bump pads 18. The method of forming the bumps 8 includes the step of forming a resist pattern on the bump pads 18 by mask-printing. Suitably, the sizes of the openings of the resist pattern are set to be smaller than those of the bump pads 18 in view of the positional deviations which may occur during mask-printing. Thereafter, solder is coated via the resist pattern. The resist is released. Thus, the bumps 8 are formed.

The locations that the mounting wirings 7, the bump pads 18, and the bumps 8 are provided on the structural piece 4 are selected in accordance with their mounting to the external substrate. Stress is prevented from being applied to the substrate 1 at mounting by locating the bumps 8 so as not to overlap the connecting portions 3 on the substrate 1.

Subsequently, the produced piece is cut into a chip size along the cut lines 16 formed on the structural piece 4 by a dicing cut saw. Thus, individual pieces are formed.

As described above, in the electronic component 50 according to a preferred embodiment of the present invention, the thickness of the structural piece 4 is about 0.05 mm and that of the protecting film 17 formed on the back surface of the substrate 1 is about 0.03 mm, that is, the total thickness is of about 0.08 mm which is added to the thickness of the substrate 1. Thus, the electronic component, which is provided to seal the IDT electrodes 2 and to be externally mounted at the surface thereof, is provided with a mere increase of about 0.08 mm in the overall thickness with respect to the thickness of the substrate 1.

Figure 6:
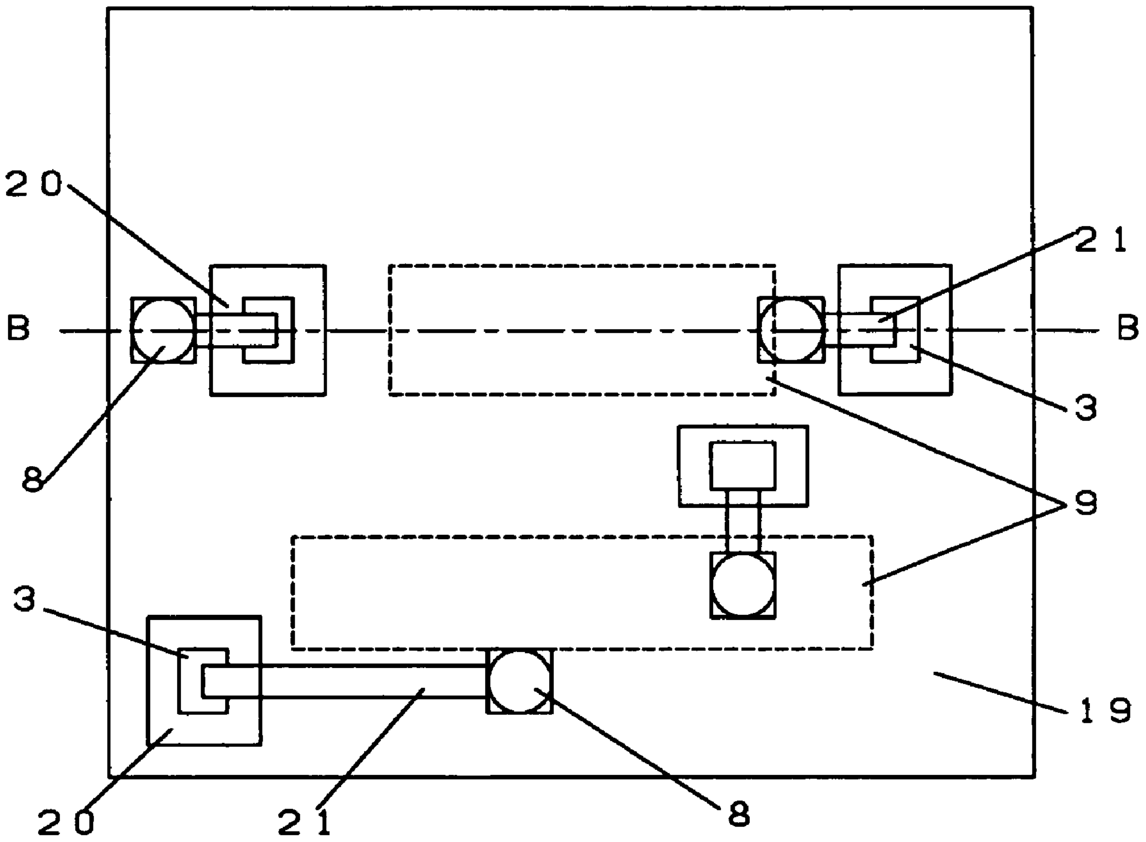
FIG. 6 is a plan view of an electronic component according to another preferred embodiment of the present invention.
Figure 7:
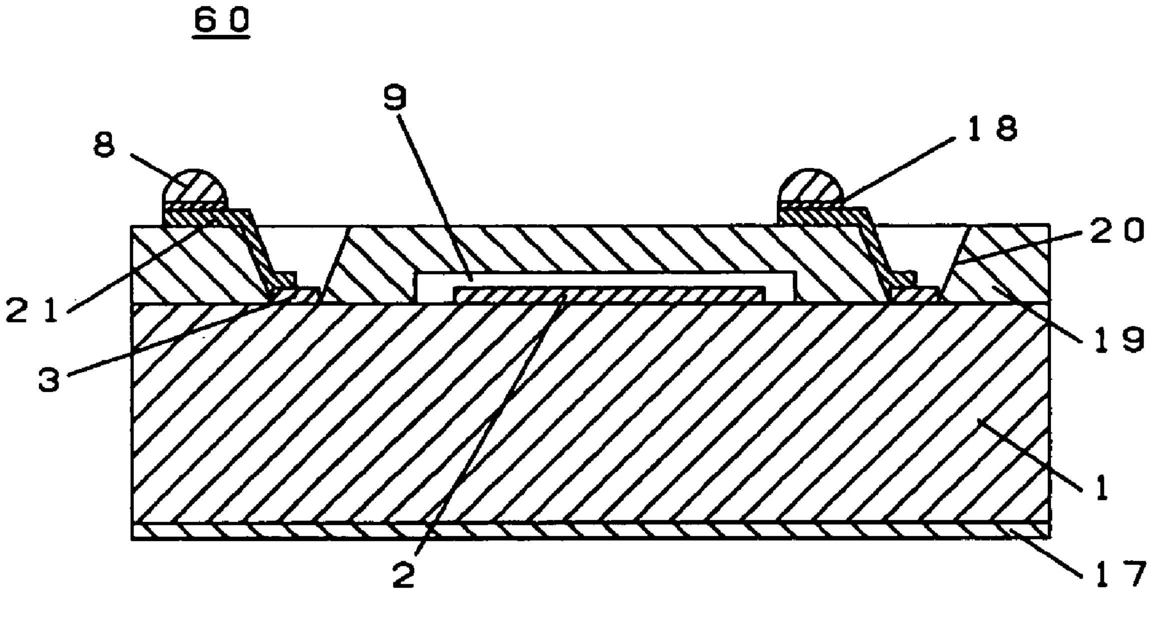
FIG. 7 is a cross-sectional view of the electronic component according to another preferred embodiment of the present invention.

FIG. 6 is a schematic plan view of an electronic component according to another preferred embodiment of the present invention. FIG. 7 is a cross-sectional view taken along line B—B in FIG. 6.

Referring to FIGS. 6 and 7, an electronic component 60 includes the substrate 1 and a structural piece 19.

A plurality of IDT electrodes 2 and the connecting portions 3 are provided on the substrate 1. The protecting film 17 is provided on the back surface of the substrate 1. The concavities 9 are provided on the lower surface of the structural piece 19. The concavities 9 have spaces so as not to disturb the vibration of the IDT electrodes 2. Mounting wirings 21 are provided on the upper surface of the structural piece 19. The bump pads 18 are provided on the upper surfaces of the mounting wirings 21. The bumps 8 are provided on the upper surfaces of the bump pads 18. Moreover, the structural piece 19 includes ordinarily tapered (becoming wider toward the substrate) through holes 20. The mounting wirings 21 are arranged in such a pattern that the mounting wirings 21 are electrically connected to the connecting portions 3 provided on the upper surface of the substrate 1 via the tapered portions of the through holes 20.

The structural piece 19 is connected to the surface of the substrate 1 where the IDT electrodes 2 are provided. In this case, the IDT electrodes 2 provided on the upper surface of the substrate 1 are covered and sealed with the concavities 9 provided in the structural piece 19.

Moreover, the connecting portions 3 provided on the substrate 1 are electrically connected to the IDT electrodes 2. Thus, a desired function is performed. Moreover, electrodes having a pattern and a film-thickness suitable for a desired function are provided on the IDT electrodes 2. The pattern is not restricted to the IDT electrodes 2. The pattern may be applied to electrodes defining the piezoelectric vibrating portion.

As described above, the electronic component is provided with the structural piece 19 which seals the IDT electrodes 2 and has the concavities 9. Thus, the electronic component 60 has a greatly reduced size and height.

Wirings for electrically connecting the substrate 1 to the mounting wirings 21 provided on the upper surface of the structural piece 19 are formed simultaneously with the mounting wirings 21, due to the through holes 20 having a forward tapered shape. Thus, the production process is simplified. The electronic component 60 is provided at a reduced cost.

The concavities 9 and the through holes 20 provided for the structural piece 19 are finely formed with a high precision via laser processing. Thus, a complicated process such as a photolithographic process is not required. Moreover, the formation is performed at a high speed. Thus, the concavities 9 and the through holes 20 are formed at a reduced cost.

The operation of the structural piece 19 is the same as that of the above-described preferred embodiment. Thus, the detailed description thereof is omitted.

Hereinafter, a method of producing the electronic component shown in FIGS. 6 and 7 will be described.

The substrate 1 is the same as that of the above-described preferred embodiment. Thus, the description thereof is not omitted.

The method of producing the structural piece 19 will be described with reference to a process flow schematically shown in FIGS. 8A and 8B.

Figure 8A:
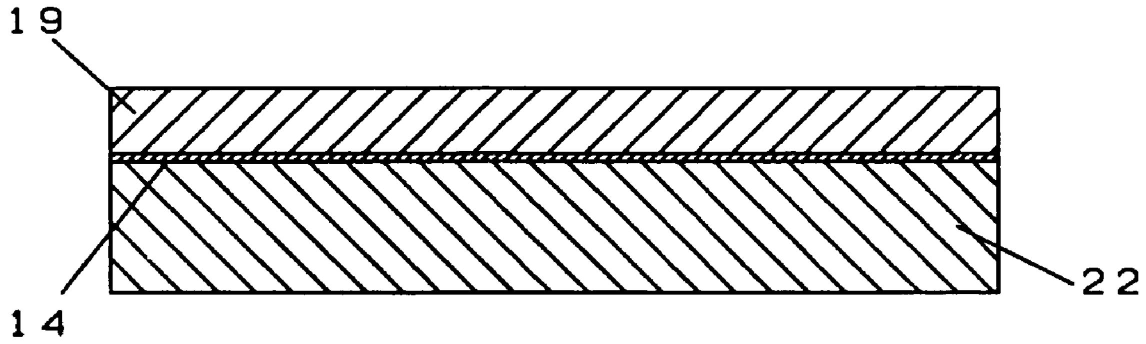
FIGS. 8A and 8B schematically show a process flow of another structural piece of an electronic component according to a preferred embodiment of the present invention.

First, as shown in FIG. 8A, the thermoplastic resin film 14 is formed on the upper surface of a glass substrate 22 having a thickness of about 1 mm. Subsequently, the structural piece 19 is bonded to the upper surface of the glass substrate 22 where the thermoplastic resin film 14 is formed.

Figure 8B:
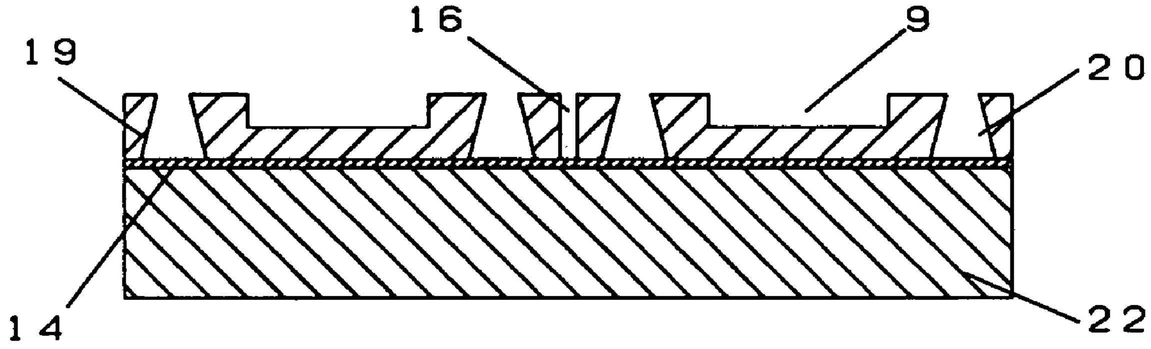

Then, as shown in FIG. 8B, the concavities 9 having spaces so as not to disturb the vibration of the IDT electrodes 2, the through holes 20 for electrically connecting the mounting wirings 21 to the connecting portions 3 formed on the upper surfaces of the substrate 1, and the cut lines 16 are formed by laser-processing the structural piece 19. The conditions for formation of the concavities 9 and the cut lines 16 are the same as those used in the above-described preferred embodiments, and the description thereof is omitted.

Subsequently, the through holes 20 are irradiated with a laser beam with a wavelength of about 355 nm from the backside of the glass substrate 22 having the structural piece 19 bonded thereto. Most of the energy irradiated by the laser beam is absorbed on the side of the structural piece 19 to which the glass substrate 22 is bonded. Thus, the through holes 20 have openings that are larger on the side of the structural piece 19 to which the glass substrate 22 is bonded. Moreover, the structural piece 19 may be bonded to a substrate having openings corresponding to the through holes 20, and a laser beam is irradiated from the substrate side. Also, in this case, the same operation is obtained.

Then, the substrate 1 and the structural piece 19 are heated and press bonded to each other, while the connecting portions 3 on the substrate 1 are aligned so as to be arranged in the openings of the through holes 20. Then, the IDT electrodes 2 are sealed with the concavities 9 formed on the structural piece 19.

Then, the glass substrate 22 is released from the structural piece 19. Since the thermoplastic resin film 14 is formed at the interface between the glass substrate 22 and the structural piece 19, the glass substrate 22 is easily removed by heating at about 150° C. Furthermore, for the purpose of marking and protecting the substrate 1, a resin film having a thickness of about 0.03 mm is formed by coating, and heat-treated to be cured. For the structural piece 19, epoxy resins, acrylic ester resins, polyimide, benzocyclobutene, cyclic olefin resins, or other suitable materials may be used. It is preferable to use resins which are strengthened by heat curing such that the substrate 1 is protected against impact.

The structural piece 19 has the same function as the structural piece 4 used in the above-described preferred embodiment.

Subsequently, the mounting wirings 21 are formed by a photolithographic process.

After a desired resist pattern is formed, Cu is formed into a film by vacuum evaporation. In this case, the mounting wirings 21 are arranged so as to be electrically connected via the through holes 20 to the connecting portions 3 disposed on the substrate 1. Since the through holes 20 are formed to have a forward tapered shape, and have a thickness of about 0.05 mm, the wirings are easily formed on the side walls of the through holes 20. Moreover, the bump pads 18 for mounting on an external substrate are formed on the mounting wirings 21 by a photolithographic process. In particular, the bump pads 18 are formed by forming a resist pattern having openings at locations corresponding to the bump pads 18 to be formed, forming an Ni film, and lifting-off. The details of the photolithographic process are the same as described above, and the description is omitted.

Next, the bumps 8 are formed on the bump pads 18. In particular, a resist pattern is formed on the bump pads 18 by mask-printing. Suitably, the resist pattern has opening sizes that are smaller than the respective bump pads 18. Thereafter, solder is applied to the resist pattern, and then, the resist is released. Thus, the bumps 8 are formed.

The produced piece is cut along the cut lines 16 formed on the structural piece 19 by a dicing cut saw. Thus, individual pieces are formed.

Accordingly, the electronic component 60 according to a preferred embodiment of the present invention, which seals the IDT electrodes and enables external mounting thereof, has an overall thickness that is increased by only about 0.08 mm.

Hereinafter, an electronic component according to another preferred embodiment of the present invention will be described. The same components as described above are designated by the same reference numerals in the above-described preferred embodiments of the present invention.

Figure 9:
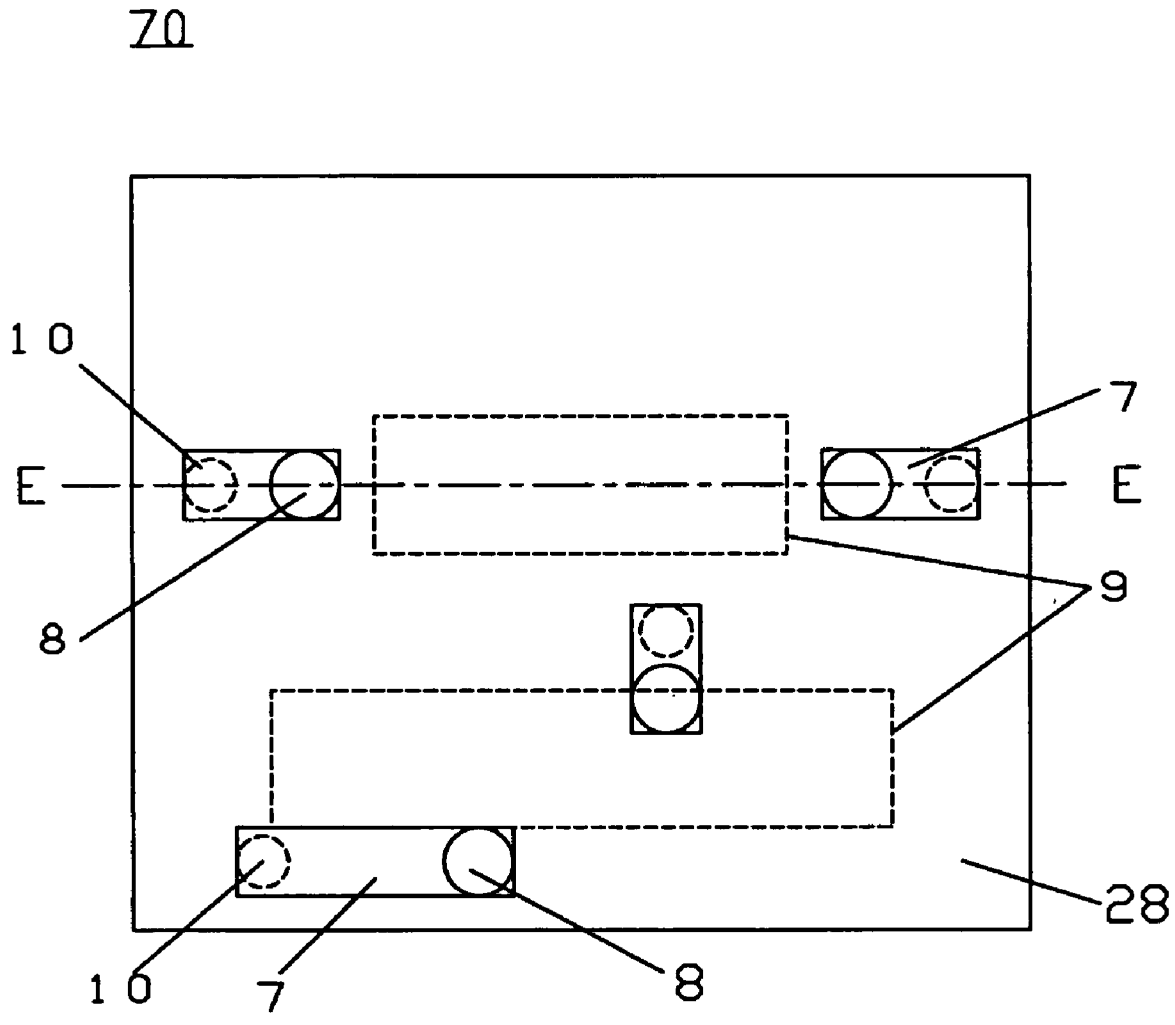
FIG. 9 is a plan view of an electronic component according to still another preferred embodiment of the present invention.
Figure 10:
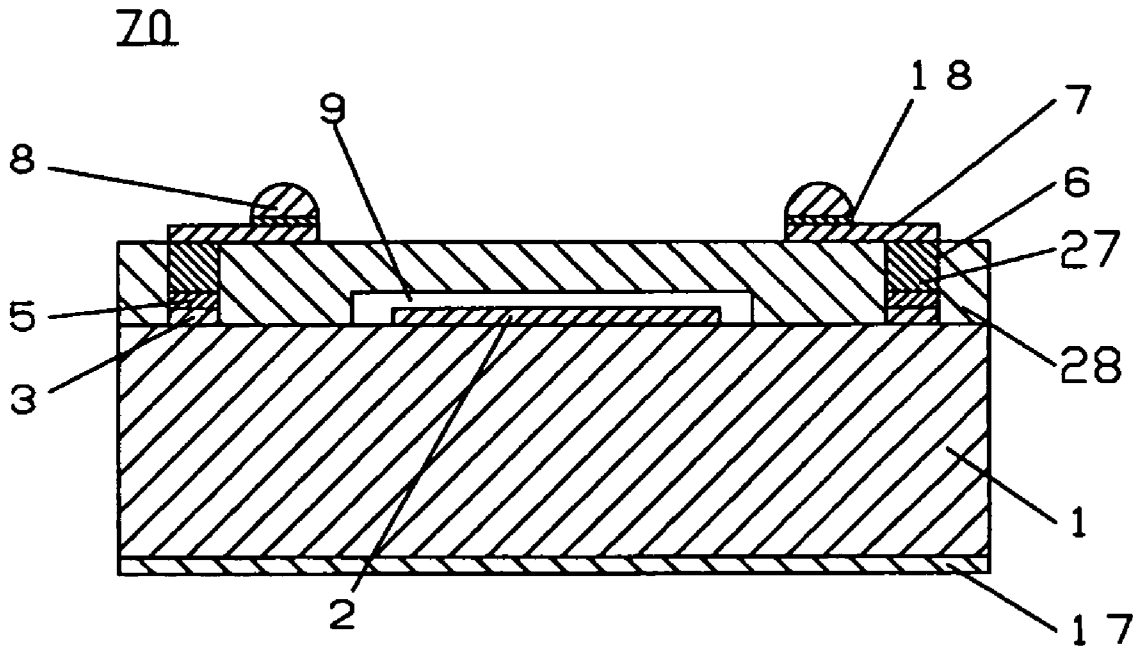
FIG. 10 is a cross-sectional view of the electronic component according to the still another preferred embodiment of the present invention.

FIG. 9 is a schematic plan view of an electronic component according to another preferred embodiment of the present invention. FIG. 10 is a cross-sectional view taken along line E—E in FIG. 9.

Referring to FIGS. 9 and 10, an electronic component 70 includes the substrate 1 and a structural piece 28.

A plurality of IDT electrodes 2 and the connecting portions 3 are provided on the substrate 1. Moreover, the protecting film 17 is provided on the back surface of the substrate 1. The concavities 9 having spaces so as not to disturb the vibration of the IDT electrodes 2 are provided on the lower surface of the structural piece 28. Moreover, the mounting wirings 7 are provided on the upper surface of the structural piece 28. The bump pads 18 are provided on the upper surfaces of the mounting wirings 7. The bumps 8 are provided on the upper surfaces of the bump pads 18. The structural piece 28 is provided with through holes 6. Cu 27 for electrically connecting the mounting wirings 7 to the pads 5 provided on the upper surface of the substrate 1 is provided in the through holes 6 (hereinafter, the Cu 27 is referred to as a connecting wiring).

The structural piece 28 is attached to the side of the substrate 1 on which the IDT electrodes 2 are provided. In this case, the IDT electrodes 2 provided on the upper surface of the substrate 1 is covered with the concavities 9 provided in the structural piece 28, such that the IDT electrodes 2 are sealed.

Moreover, the pads 5 provided on the substrate 1 are electrically connected to the Cu 27 provided in the through holes 6. Electrodes having a pattern and a film-thickness corresponding to a required function are provided for the IDT electrodes 2. The pattern is not restricted to the IDT electrodes 2. The pattern may be applied to electrodes defining the piezoelectric vibration portion.

As described above, the structural piece 28 is provided which seals the IDT electrodes 2 and has the concavities 9 and the connecting wirings. Thus, an increase in the volume of the electronic component 70, caused by the sealing and the electrical connection, is suppressed as much as possible. The thickness of the structural piece 28 is preferably about 30 nm. Thus, the electronic component 70 having a greatly reduced size and height is provided.

Moreover, the through holes 6 are formed simultaneously with the concavities 9 by the photolithographic process. Thus, a plurality of processes are not required for the formation thereof. Furthermore, for the structural piece 28, the same resin material as that for the substrate 1 is used such that the thermal expansion coefficients are approximately equal to each other. Thus, positional slipping therebetween, which may occur due to the difference between the thermal expansion coefficients, is effectively prevented. Thus, the electronic component 30 is also suitable for mass production which is performed on a wafer level. The other constitutions and operation are preferably the same as those of the above-described preferred embodiments, and the description thereof is omitted.

Hereinafter, a method of producing the electronic component 70 shown in FIGS. 9 and 10 will be described.

The method of producing the substrate 1 is preferably the same as that in the above-described preferred embodiments, and the description is omitted.

A production method for the structural piece 28 will be described with reference to a process flow schematically illustrated in FIGS. 11A and 11B.

Figure 11A:
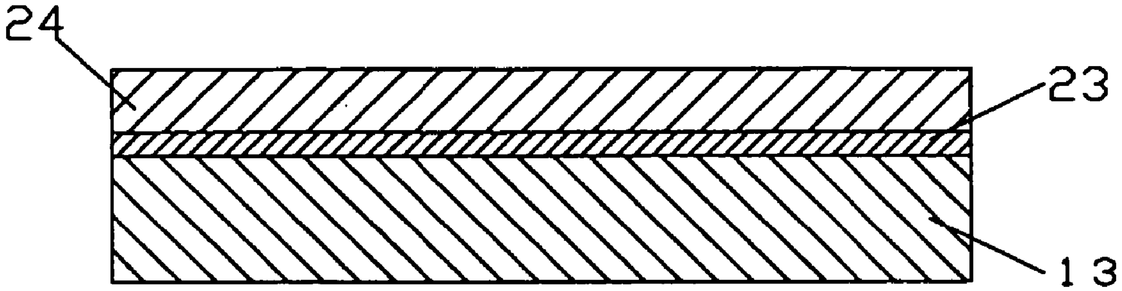
FIGS. 11A and 11B schematically show a process flow of the formation of a structural piece of an electronic component according to a preferred embodiment of the present invention.

First, as shown in FIG. 11A, a thermoplastic resin film 23 is formed on the mirror-finished temporary-bonding substrate 13, i.e., having a thickness of about 5 mm. Subsequently, a negative photosensitive material 24 is coated onto the upper surface of the thermoplastic resin film 23 so as to have a thickness of about 30 nm by a spin coater or other suitable device. As the photosensitive material 24, any one of photosensitive polyimide, benzocyclobutene, cyclic polyolefin resins, photosensitive glass-type materials, photosensitive polysilan, photosensitive polysilicon, acrylic ester resins, and other suitable materials may be used.

Figure 11B:
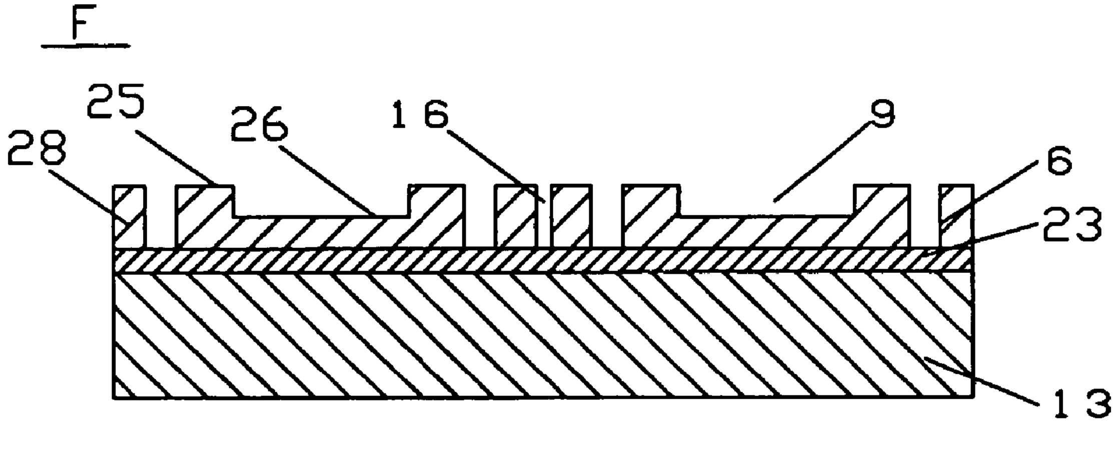

Subsequently, as shown in FIG. 11B, the through holes 6 and the cut lines 16 are processed to form the structural piece 28, such that the concavities 9 having spaces so as not to disturb the vibration of the IDT electrodes 2, the mounting wirings 21, and the connecting portions 3 formed on the upper surface of the substrate 1 are electrically connected to the photosensitive resin 24. The structural piece 28 is formed by development with exposure via a photolithographic mask (not shown). The photolithographic mask is provided with the following patterns: a light-shielding pattern from which the photosensitive material 24 is removed at development at the portion corresponding to the through holes 6 and the cut lines 16, a light-transmitting pattern in which the photosensitive resin 24 is resistant to a developer at development at the portion corresponding to the side walls 25 of the concavities 9, and a grating pattern from which the photosensitive resin 24 is not completely removed at development at the portion corresponding to the top plates 26 of the concavities 9. Thereafter, the development is performed. It should be noted that the exposure to the structural piece 28 formed as described above is performed at one time.

In this case, the grating portion of the used photolithographic mask includes light-transmitting portions each having a substantially square shape with a length of one side of about 2 μm. In the grating portion, the light-transmitting portions and light-shielding portions are arranged at a ratio of about 1:1. The size in the depth direction of each of the concavities 9 is determined by the ratio for the arrangement. When a large depth is required, the ratio of the light-shielding portion is increased. When a small depth is required, the ratio of the light-shielding portion is decreased. Thus, the depth is efficiently controlled.

Subsequently, the structural piece 28 is heated at about 350° C. such that a component, such as a solvent, included in the structural piece 28 is removed, and the curing is performed. Thus, a piece G is produced in which the structural piece 28 provided with the concavities 9 arranged so as not to disturb the vibration of the IDT electrodes 2, the through holes 6 in which the connecting wirings are to be formed, and the cut lines 16 are formed on the temporary-bonding substrate 13. The concavities 9, the through holes 6, and the cut lines 16 are preferably formed by a laser process similarly to those in the above-described preferred embodiments.

Hereinafter, another method of producing an electronic component according to a preferred embodiment of the present invention will be described with reference to a process flow of the method schematically shown in FIGS. 12A, 12B, and 12C.

Figure 12A:
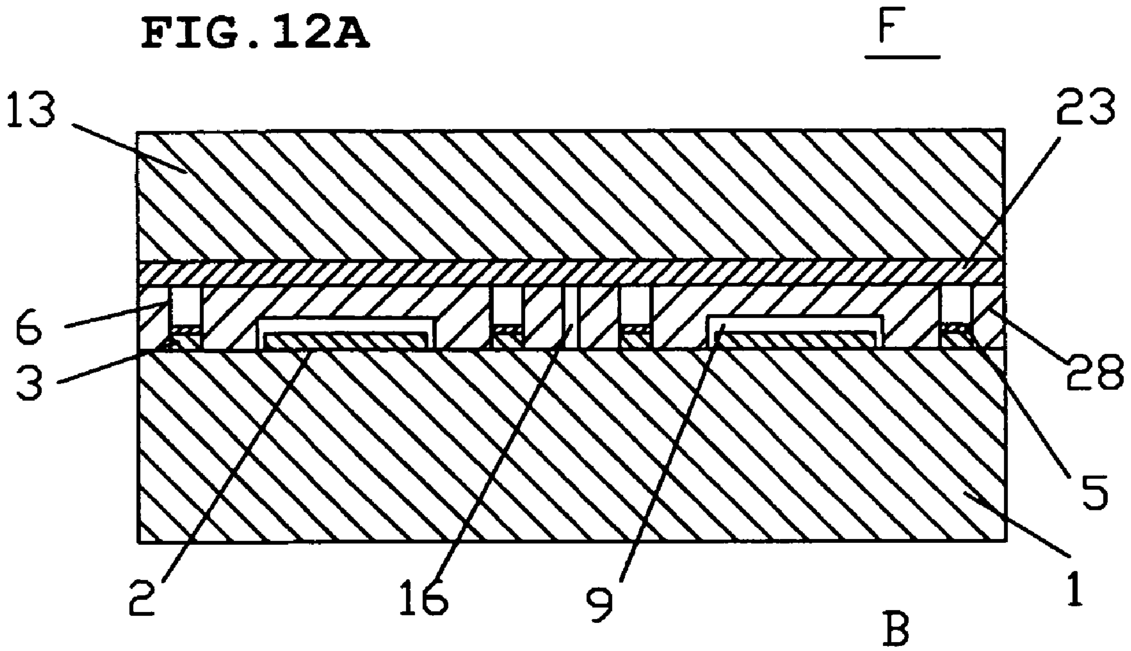
FIGS. 12A to 12C schematically show a process flow of another electronic component according to a preferred embodiment of the present invention.

First, as shown in FIG. 12A, a piece F is mounted on a piece B.

Both of the pieces B and F are heated and press-bonded to each other, while the through holes 6 are aligned with the pads 5 on the substrate 1, and also, the concavities 9 arranged so as not to disturb the vibration of the IDT electrodes 2 are aligned with the IDT electrodes 2. Suitably, the bonding is performed using a bonding device having both of the functions of aligning and heating. The IDT electrodes 2 are sealed with the structural piece 28.

The thermal expansion coefficient of the structural piece 28 is selected, depending on a material used for the substrate 1. Thereby, the positional slipping, which may occur at the bonding, is suppressed as much as possible.

Figure 12B:
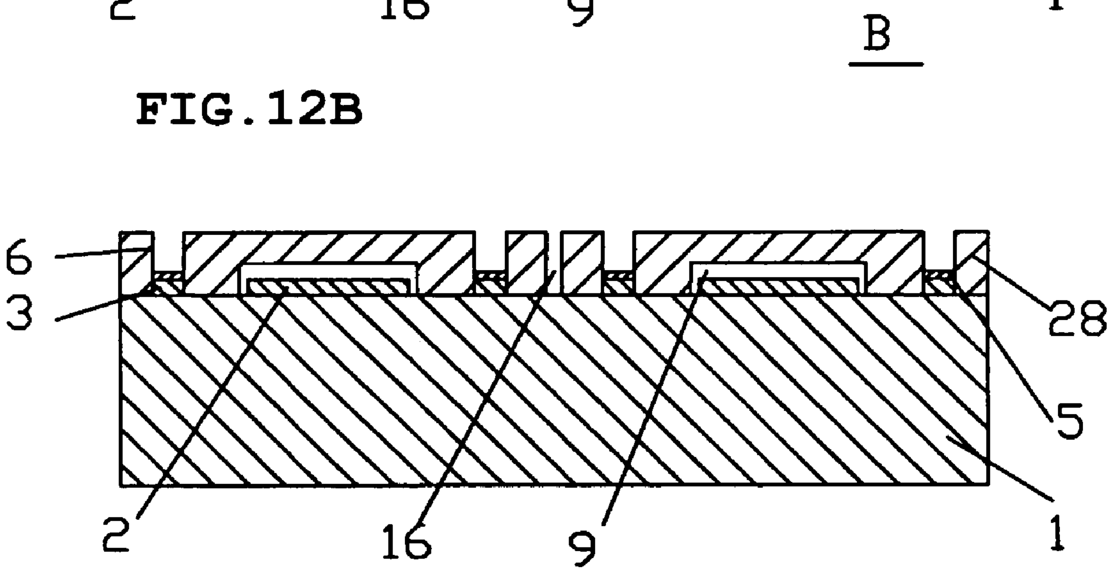

Then, as shown in FIG. 12B, the temporary-bonding substrate 13 is released. The temporary-bonding substrate 13 is easily released by heating at about 150° C., since the thermoplastic resin is provided at the interface between the temporary-bonding substrate 13 and the structural piece 28. If there is a residue of the thermoplastic resin on the structural piece 28 after the releasing, the structural piece 28 is cleaned.

Figure 12C:
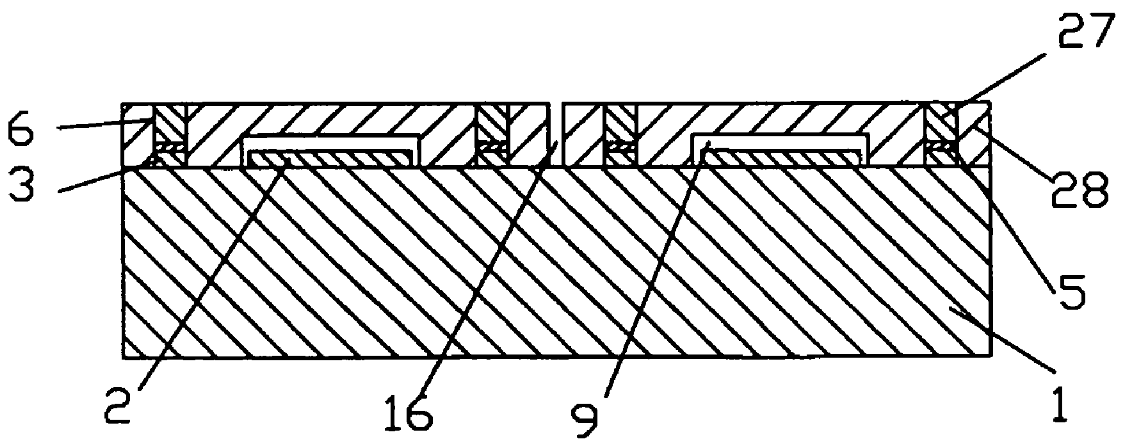

Subsequently, as shown in FIG. 12C, Cu 27 is formed in the through holes 6 by electrolytic plating. Thereby, electrical connection between the connecting portions 5 formed on the substrate 1 and the mounting wirings (not described) formed after the plating is secured.

The mounting wirings are formed on the upper surface of the structural piece 28 similarly to the preferred embodiment shown in FIG. 10. Bump pads are formed on the upper surfaces of the mounting wirings, and bumps are formed on the upper surfaces of the bump pads (not shown).

In the above-described preferred embodiments, a negative photosensitive resin is used as the photosensitive resin 24 which forms the structural piece 28. Alternatively, a positive photosensitive resin may be used.

The structural piece 28 is formed by development with exposure via a photolithographic mask. The photolithographic mask is provided with the following patterns: a light-transmitting pattern from which the photosensitive material 24 is completely removed at development at the portion corresponding to the through holes 6 and the cut lines 16, a light-shielding pattern in which the photosensitive material 24 is resistant to a developing liquid at development at the portion corresponding to the side walls 25 forming the concavities 9, and a grating portion from which the photosensitive material cannot be completely removed at development at the portion corresponding to each of the top plates 26 forming the concavities 9. Thereafter, the development is performed.

Moreover, the through holes 6 are formed so as to have a forward tapered shape.

In this case, a negative photosensitive material as the photosensitive material 24 is coated. Then, the exposure state of the temporary-bonding substrate 13 side is adjusted to be insufficient by controlling the exposure conditions. As a result, the cross-linking cannot be sufficiently carried out. Thus, the resistance to a developing liquid of the photosensitive material 24 on the temporary-bonding substrate 13 side is low. Thus, the through holes 6 are formed in an inverted-tapered shape on the temporary-bonding substrate 13. Thereafter, the structural piece 28 is bonded to the substrate 1, and the temporary-bonding substrate 13 is released. Thus, the through holes 6 each have a forward tapered shape. The electrical connection between the substrate 1 and the wiring patterns is secured by simultaneous formation of the wiring patterns and the connecting wirings, due to the forward tapered shape.

According to another method, a glass temporary substrate of which the back side is surface-roughened is used as the temporary-bonding substrate 13. Further, a positive photosensitive resin as the photosensitive material is coated onto the glass temporary substrate, and is exposed. In this case, light irregularly reflected from the backside of the glass temporary substrate hits the lower layer of the photosensitive resin 24. As a result, cross-linking further proceeds in the lower layer of the photosensitive resin 24. The resistance to a developing liquid of the lower layer of the photosensitive resin 24 is further enhanced. Thus, the through holes 6 having an inverted-tapered shape are formed on the temporary-bonding substrate 13. Thereafter, the structural piece 28 is joined to the substrate 1, and the temporary-bonding substrate 13 is released. Thus, the through holes 6 each have a forward tapered shape. The electrical connection between the substrate 1 and the wiring patterns is secured by simultaneous formation of the wiring patterns and the connecting wirings, due to the forward tapered shape.

Moreover, the mounting wirings may be formed by laminating another structural piece onto the structural piece 28. The outline of the constitution will be described below.

Figure 13:
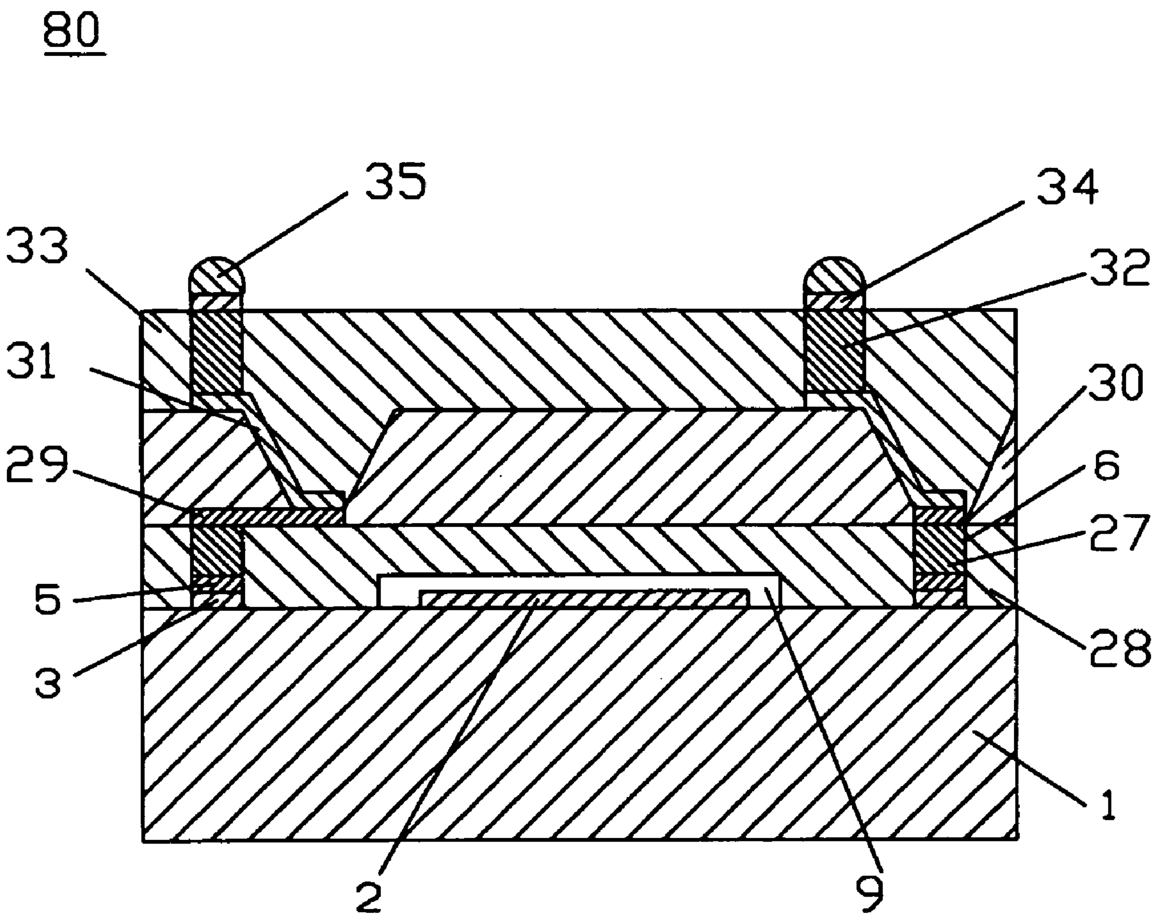
FIG. 13 is a cross-sectional view of an electronic component according to another preferred embodiment of the present invention.

As shown in FIG. 13, wirings 29 are formed on the upper surface of the structural piece 28 shown in FIG. 12C by a photolithographic process. Then, a structural piece 30 having through holes with large openings is formed on the structural piece 28 including the wirings 29. Thereafter, mounting wirings 31 are formed on the structural piece 30 by the photolithographic process. Moreover, a structural piece 33 having through holes is formed on the upper surface of the structural piece 30 including the mounting wirings 31. An electroconductive material 32 is filled into the through holes of the structural piece 33 to form connecting wirings. Furthermore, bump pads 34 are formed on the upper surfaces of the conductive material 32. Further, bumps 35 are formed on the upper surfaces of the bump pads 34.

According to the above-described method, the mounting wirings are formed in the thickness direction of the electronic component. Thus, the method suppresses the size in the width direction of the electronic component from being increased by the mounting wirings.

Thus, an electronic component 80 is formed.

Moreover, the piezoelectric vibrating portion of the electronic component of the present invention may be formed of a piezoelectric thin-film. Hereinafter, the outline of the constitution will be described.

Figure 14:
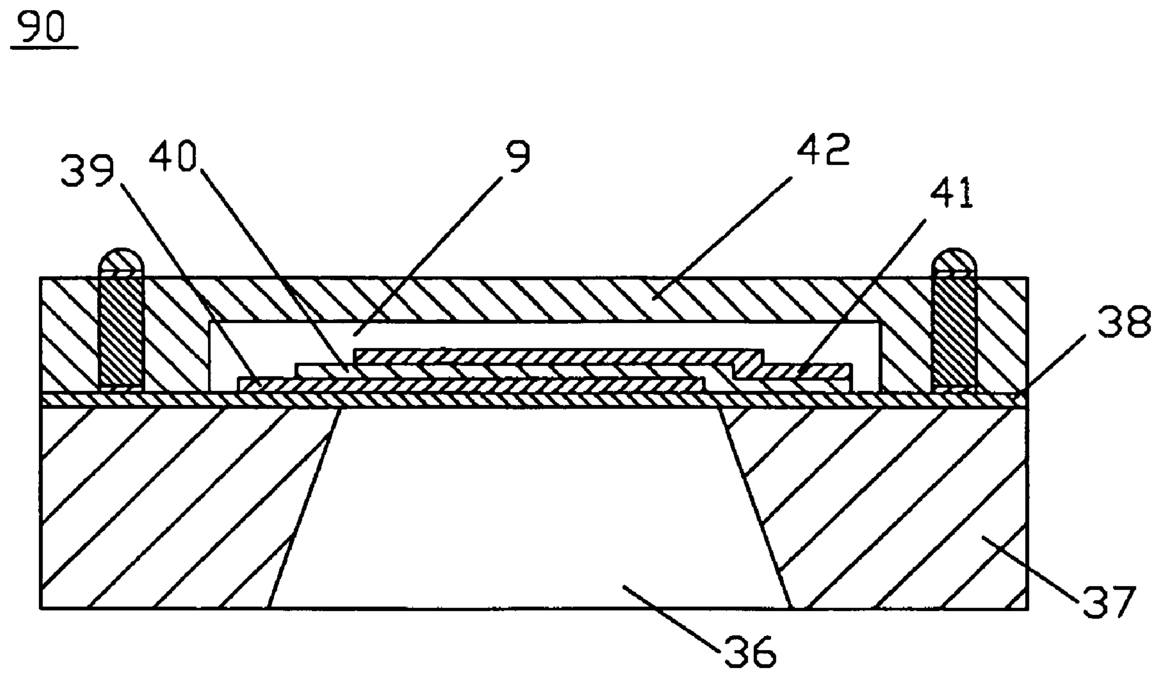
FIG. 14 is a cross-sectional view of an electronic component according to still another preferred embodiment of the present invention.

As shown in FIG. 14, an insulating film 38, e.g., made of $SiO_2$, is formed on a silicon semiconductor 37 having a concavity 36. Next, a metallic film, e.g., including Al as a major component, which defines lower electrode 39 is formed on the insulating film 38. Thereafter, a piezoelectric thin-film 40, e.g., made of ZnO, is formed on the lower electrode 39. Then, a metallic film including Al as a major component which defines an upper electrode 41 is formed on the piezoelectric thin-film 40. Patterns corresponding to desired functions are formed on the lower electrode 39, the piezoelectric thin-film 40, and the upper electrode 41, respectively. Here, the detailed description of the patterns is omitted.

The piezoelectric thin-film 40 constitutes the piezoelectric vibrating portion in the portion thereof through which the lower electrode 39 and the upper electrode 41 are opposed to each other. The concavity 36 formed in the silicon semiconductor 37 is positioned in correspondence to the piezoelectric vibrating portion.

Subsequently, a structural piece 42 having a concavity 9 at the lower surface thereof is attached to the insulating film 38 on the silicon semiconductor 37. In this case, the above-described piezoelectric vibrating portion is covered and sealed with the concavity 9 of the structural piece 42. Mounting wirings are preferably formed on the upper surface of the structural piece 42. In this case, wiring-connecting portions for electrically connecting the mounting wirings to the piezoelectric vibrating portion defined by the piezoelectric thin-film 40 are formed. The mounting wirings may also be formed on the silicon semiconductor 37 side.

Thus, an electronic component 90 is formed.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. An electronic component comprising:

a substrate:

at least one piezoelectric vibrating portion and a connecting portion provided on the substrate; and a structural piece made of a resin material having a flat plate shape and directly covering at least the at least one piezoelectric vibrating portion such that no structural elements are disposed between the structural piece and the at least one piezoelectric vibrating portion; wherein the structural piece has an integrated structure and is provided with a concavity including a top portion and side walls covering the at least one piezoelectric vibrating portion, the concavity defining a space so as not to disturb at least the vibration of the piezoelectric vibrating portion;

the structural piece includes a mounting portion provided on the upper surface thereof, and is provided with a connecting wiring arranged to electrically connect the mounting portion and the connecting portion; and a bump is arranged on the mounting portion such that the bump does not overlap the connecting portion in a thickness direction of the electronic component.

2. An electronic component according to claim 1, wherein the structural piece seals at least the at least one piezoelectric vibrating portion.

3. An electronic component according to claim 1, wherein the concavity is formed by half-processing the structural piece made of a resin material using a laser beam.

4. An electronic component according to claim 1, wherein the concavity is formed by processing the structural piece made of a resin material by a photolithographic process.

5. An electronic component according to claim 3, wherein the structural piece is made of a polyimide film or a liquid crystal polymer film.

6. An electronic component according to claim 4, wherein the structural piece is made from a photosensitive material.

7. An electronic component according to claim 1, wherein the substrate is made of a material selected from the group consisting of $LiTaO_3$, quartz, $LiNbO_3$ and $Li_2B_4O_7$.

8. An electronic component according to claim 1, wherein the at least one piezoelectric vibrating portion includes electrodes made of a material selected from the group consisting of Al, Cu, an Al—Cu alloy and Au.

9. An electronic component according to claim 1, wherein the structural piece includes at least one through hole.

* * * * *